(12) United States Patent
Chen

(10) Patent No.: US 8,815,655 B2
(45) Date of Patent: Aug. 26, 2014

(54) METHOD FOR MANUFACTURING SEMICONDUCTOR DEVICE

(71) Applicant: Macronix International Co., Ltd., Hsinchu (TW)

(72) Inventor: Shih-Hung Chen, HsinChu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/727,139

(22) Filed: Dec. 26, 2012

(65) Prior Publication Data

US 2014/0175532 A1    Jun. 26, 2014

(51) Int. Cl.
*H01L 21/84* (2006.01)

(52) U.S. Cl.
USPC .......................................... 438/149; 257/324

(58) Field of Classification Search
USPC .......................................... 257/324; 438/149
See application file for complete search history.

(56) References Cited

U.S. PATENT DOCUMENTS

| | | | | |
|---|---|---|---|---|
| 8,455,940 B2* | 6/2013 | Lee et al. | | 257/324 |
| 2009/0267135 A1* | 10/2009 | Tanaka et al. | | 257/324 |
| 2011/0233652 A1* | 9/2011 | Shino et al. | | 257/324 |
| 2011/0303962 A1* | 12/2011 | Lim et al. | | 257/316 |
| 2012/0206979 A1* | 8/2012 | Shin et al. | | 365/185.26 |
| 2014/0035023 A1* | 2/2014 | Ahn | | 257/324 |

* cited by examiner

*Primary Examiner* — Thao P Le
(74) *Attorney, Agent, or Firm* — McClure, Qualey & Rodack, LLP

(57) ABSTRACT

A method for manufacturing semiconductor device is disclosed. A substrate with a conductive layer is provided, and a dummy layer is formed on the conductive layer. The dummy layer and at least a portion of the conductive layer are patterned to form several trenches. A first dielectric layer is formed to fill into the trenches so as to form several first dielectric elements in the trenches. The dummy layer is removed to expose parts of the first dielectric elements. A second dielectric layer is formed on the exposed parts of the first dielectric elements, and the second dielectric layer is patterned so that a spacer is formed at a lateral side of each exposed first dielectric element. The conductive layer is patterned by the spacers, so that a patterned conductive portion is formed at each lateral side of each first dielectric element.

9 Claims, 19 Drawing Sheets

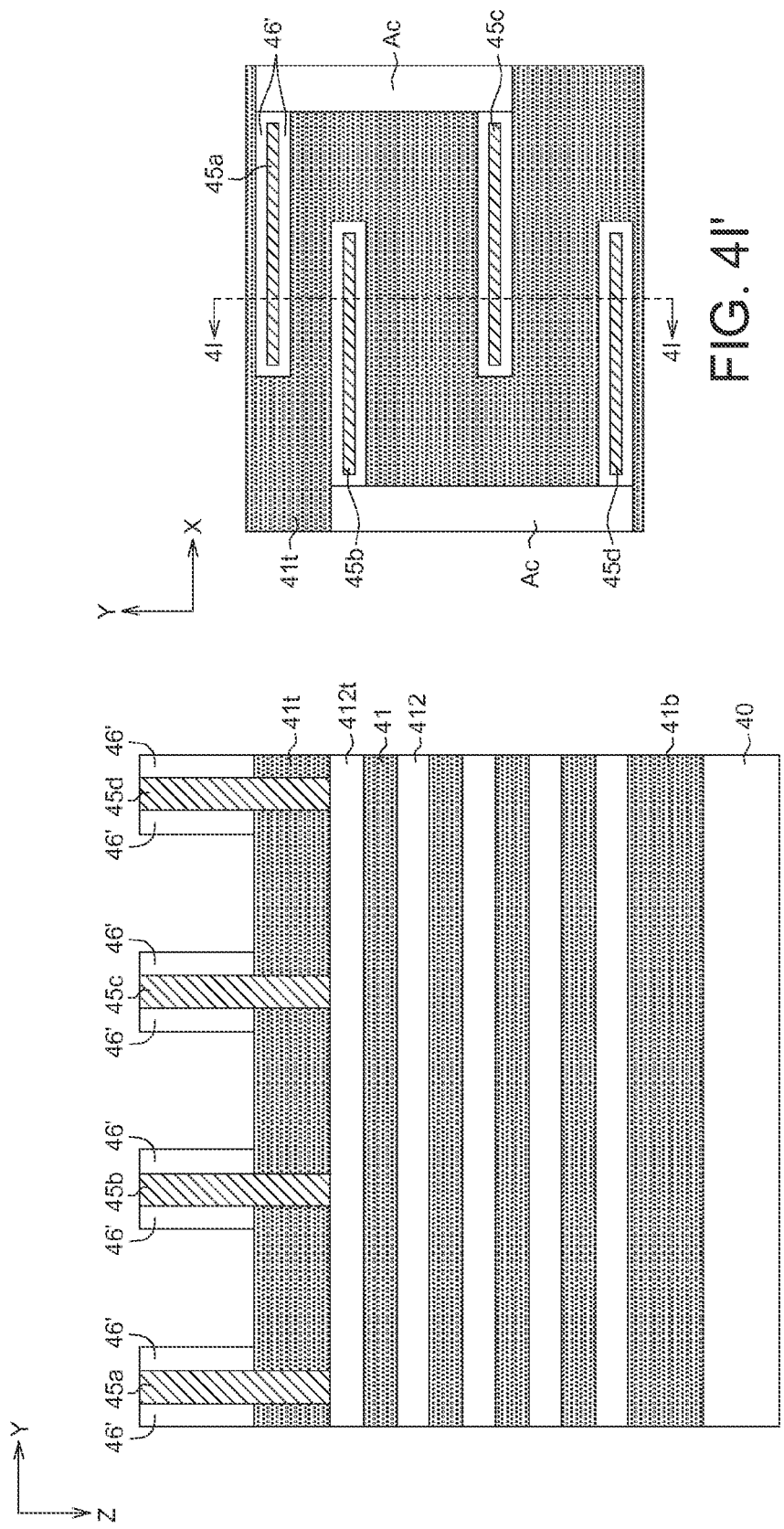

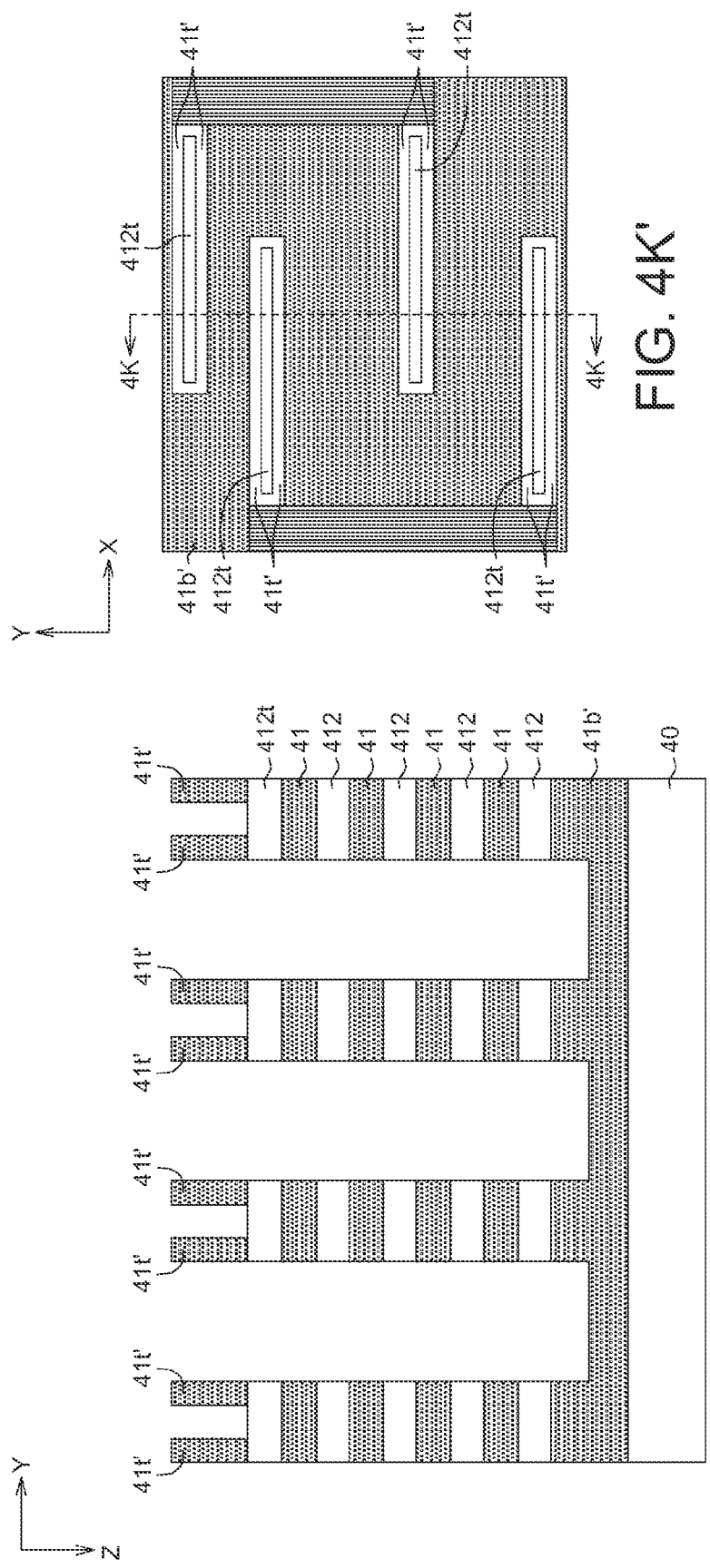

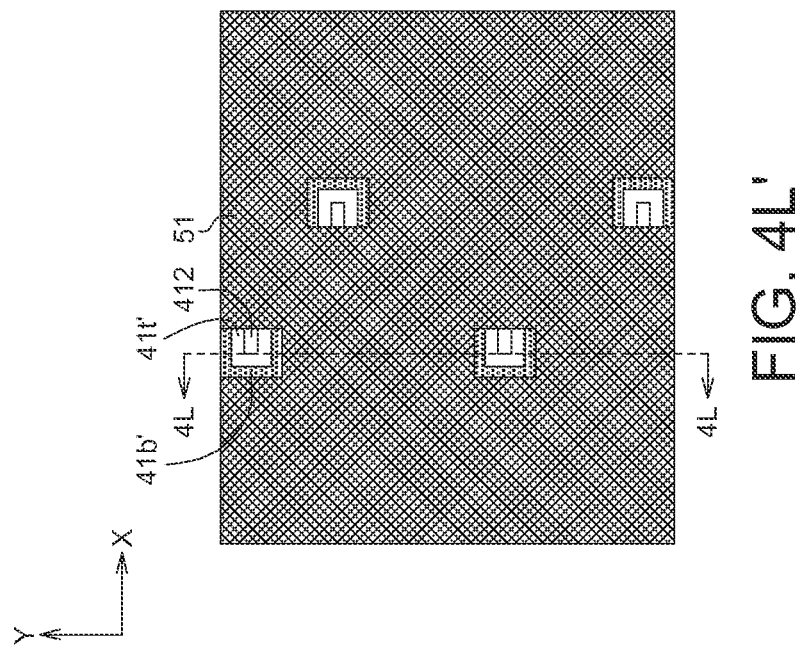
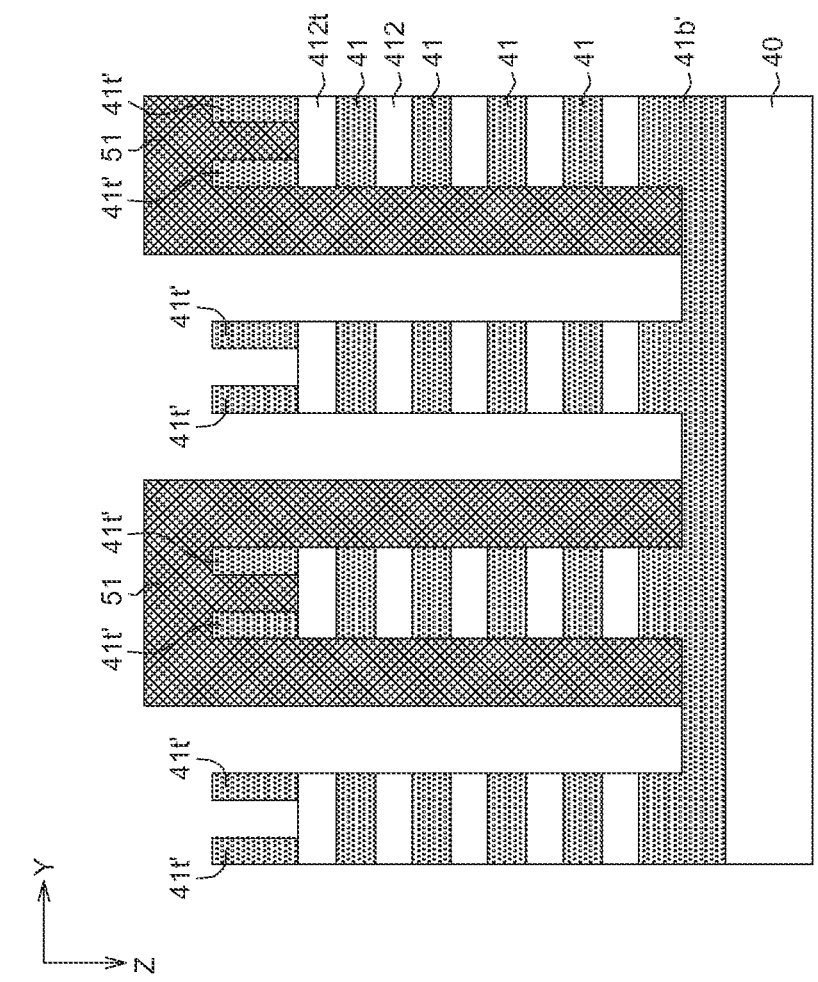
FIG. 4L'
FIG. 4L

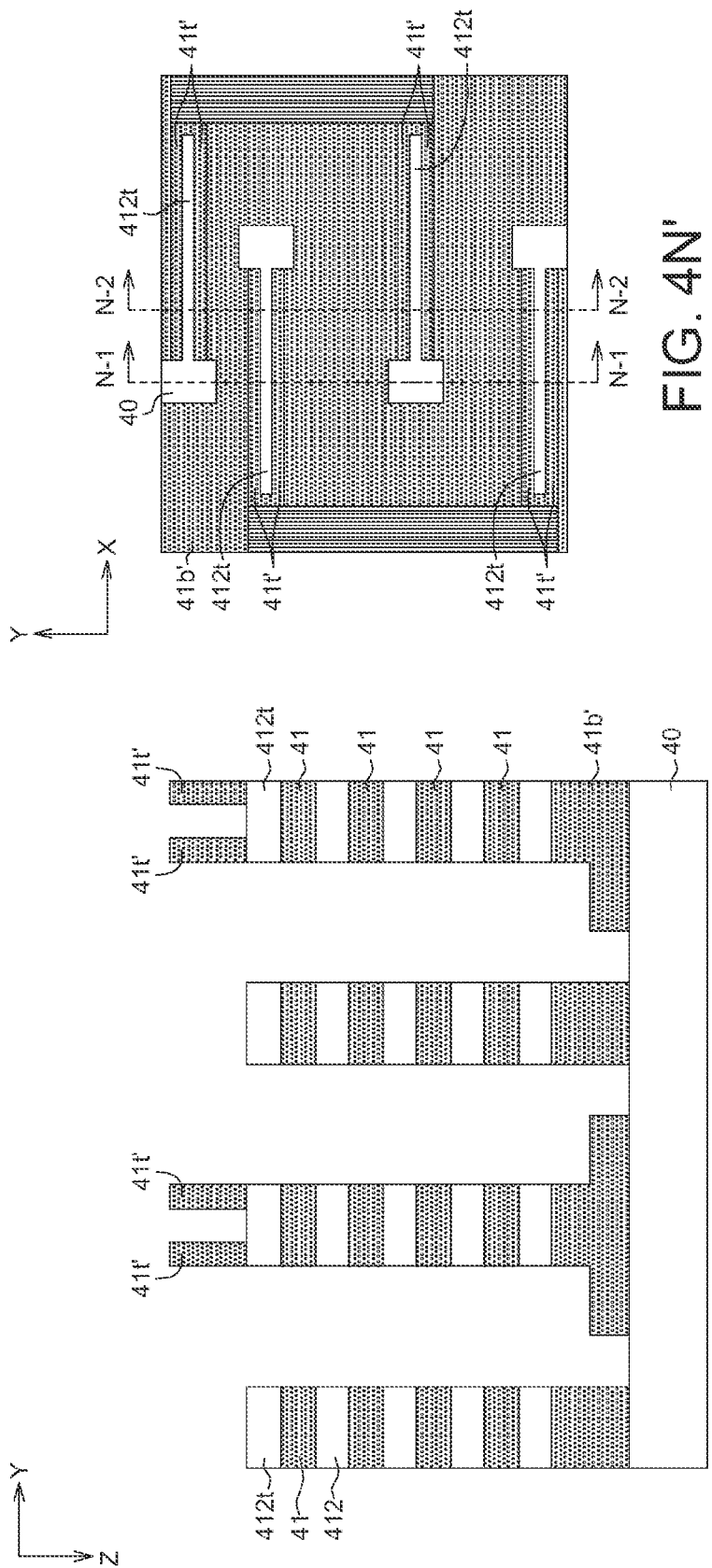

METHOD FOR MANUFACTURING SEMICONDUCTOR DEVICE

BACKGROUND

1. Field of the Invention

The disclosure relates in general to a method for manufacturing semiconductor device and structure manufactured by the same, more particularly to a method for manufacturing semiconductor device using self-aligned double-patterning process.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

Recently, various 3D stacked structures, with single-gate unit cells, double gate unit cells and surrounding gate unit cells, have been provided. However, the more spaces occupied by the charge trapping multilayer (such as ONO multilayer), the more design rules to be considered in the size reduction of 3D stacked structure, which raises the difficulties of reducing size of unit cell. Compared to the 3D stacked structures with single-gate unit cells (each unit cell having one side ONO layer), the 3D stacked structures with double gate unit cells and surrounding gate unit cells would limit the potential and ability for size reduction. Moreover, if the thickness of the charge trapping multilayer is too thin, it would induce the issue of charge retention. Therefore, the thickness of the charge trapping multilayer has to be sufficient for charge retention when size of cell unit is reduced. To reduce the size of the 3D stacked structures, the charge trapping multilayer is not the only factor to be consider, considerations of design rules for other elements and effects on the electrical performance have to be included. The 3D stacked structures with double gate unit cells and surrounding gate unit cells are more complicated than that with single gate unit cells, which increase the difficulty of design and cost of manufacturing process.

Thus, it is desirable to develop a 3D memory structure not only with larger number of multiple planes being stacked to achieve greater storage capacity, but also with smaller unit cells and excellent electrical properties (such as reliability and stability of data storage), so that the smaller memory elements still can be erased and programmed. Moreover, the reduced dimensions of the 3D memory structures might create the thinner and higher patterns. The thin and high patterns (ex: an aspect ratio of a height of the pattern to its width is too high) of the 3D memory structure would be fallen down or bended easily during the manufacturing process. Therefore, it is one of the important goals to develop the related procedures for making the thinner but solid patterns of the 3D memory structure. Accordingly, it is desirable to fabricate a 3D memory structure with high speed and solid construction, and that 3D memory structure is also manufactured by not complicated manufacturing process thereby diminishing the manufacturing cost.

SUMMARY

The disclosure relates to a method for manufacturing semiconductor device and structure manufactured by the same. The method of the embodiment adopting a self-aligned double-patterning process rapidly and simply fabricates the structure, and the patterns of the structure is self-aligned and solid.

According to the present disclosure, a method for manufacturing semiconductor device is provided, comprising providing a substrate with a conductive layer formed thereon; forming a dummy layer on the conductive layer, and patterning the dummy layer and at least a portion of the conductive layer to form a plurality of trenches; forming a first dielectric layer to fill into the trenches so as to form a plurality of first dielectric elements in the trenches; removing the dummy layer to expose parts of the first dielectric elements; forming a second dielectric layer on the exposed parts of the first dielectric elements, and patterning the second dielectric layer so that a spacer is formed at a lateral side of each exposed first dielectric element; and patterning the conductive layer by the spacers, so that a patterned conductive portion is formed at each of the lateral sides of each first dielectric element.

According to the present disclosure, a semiconductor device is provided, comprising a substrate and a plurality of stacked structures vertically formed on the substrate. Each stacked structure comprises a plurality of conductive layers and a plurality of insulating layers alternately stacked above the substrate; and top conductive layer above the conductive layers and comprising two patterned top conductive portions spaced apart form each other.

According to the present disclosure, another semiconductor device is provided, comprising a substrate and a conductive layer formed on the substrate. The conductive layer comprises an upper portion having a plurality of upper patterns, and an lower portion positioned beneath the upper portion and having a plurality of lower patterns, wherein the upper patterns have double density than the lower patterns.

The disclosure will become apparent from the following detailed description of the preferred but non-limiting embodiments. The following description is made with reference to the accompanying drawings.

BRIEF DESCRIPTION OF THE DRAWINGS

FIG. 4A~FIG. 4K illustrate a method for manufacturing a 3D memory structure according to the second embodiment of the disclosure.

FIG. 4L~FIG. 4N-2 illustrate the process subsequent to steps illustrated in FIG. 4A~FIG. 4K for manufacturing the 3D memory structure. FIG. 4L' is a top view of the structure of FIG. 4L. FIG. 4M' is a top view of the structure of FIG. 4M. FIG. 4N' is a top view of the structures of FIG. 4N-1 and FIG. 4N-2. FIG. 4N-1 and FIG. 4N-2 are cross-sectional views along the cross-sectional lines 4N-1 and 4N-2 of FIG. 4N'.

DETAILED DESCRIPTION

The embodiments of the present disclosure disclosed below are for elaborating a method for manufacturing semiconductor device and structure manufactured by the same. A self-aligned double-patterning process is adopted for manufacturing the semiconductor device of the embodiment. The disclosure is applicable to any of two-dimensional (2D) and three-dimensional (3D) semiconductor structures. However, the descriptions disclosed in the embodiments of the disclosure such as detailed construction, manufacturing steps and material selections are for illustration only, not for limiting the scope of protection of the disclosure.

Figure 1A:
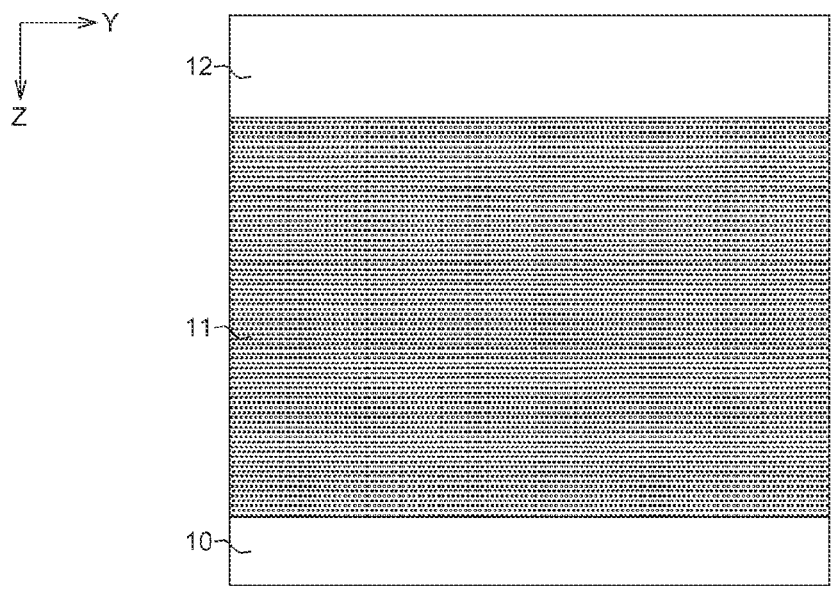
FIG. 1A~FIG. 1F illustrate a method for manufacturing a semiconductor device according to the first embodiment of the disclosure.

FIG. 1A~FIG. 1F illustrate a method for manufacturing a semiconductor device according to the first embodiment of the disclosure. As shown in FIG. 1A, a substrate 10 is provided. The substrate 10 could be a base plate with an insulation layer such as an oxide layer (ex: silicon oxide) formed thereon. Also, a conductive layer 11 (such as polysilicon) is formed on the substrate 10. A dummy layer 12 is formed on the conductive layer 11. In one embodiment, an oxide layer (i.e. dummy oxide layer) or other suitable materials could be deposited to form on the conductive layer 11 as the dummy layer 12.

Figure 1B:
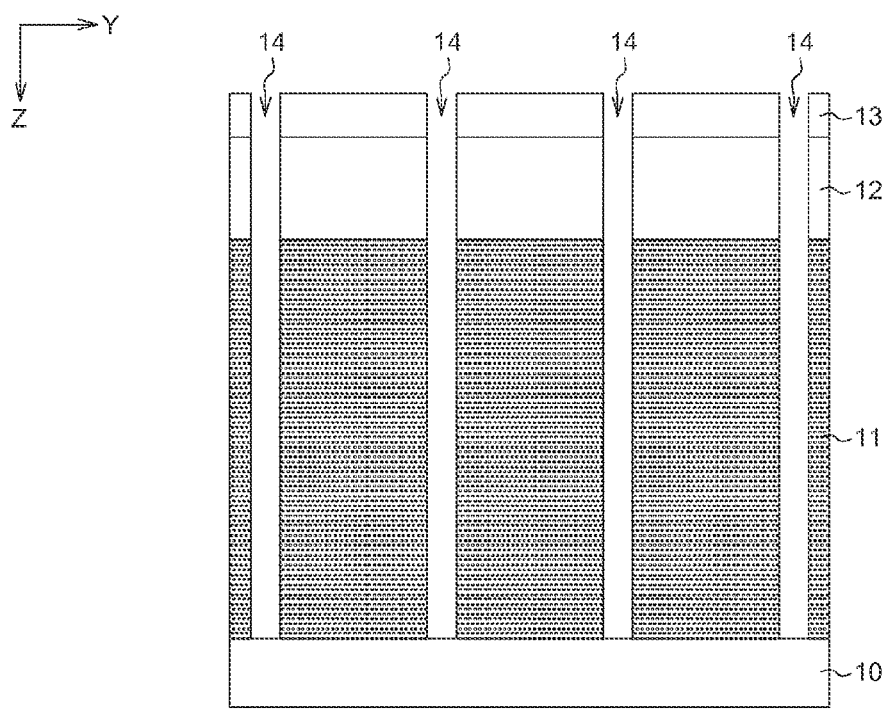

The dummy layer 12 and at least a portion of the conductive layer 11 are patterned to form a plurality of trenches 14. In the embodiment, the dummy layer 12 and the conductive layer 11 are patterned by a patterned PR 13 to form the trenches 14, as shown in FIG. 1B. Afterwards, the patterned PR 13 is removed. In this embodiment, the trenches 14 expose the surface of the substrate 10. However, the disclosure is not limited thereto, and it is also applicable to etch only a portion of the conductive layer 11. This is a reverse tone of the core pattern for the double pattern process.

Figure 1C:
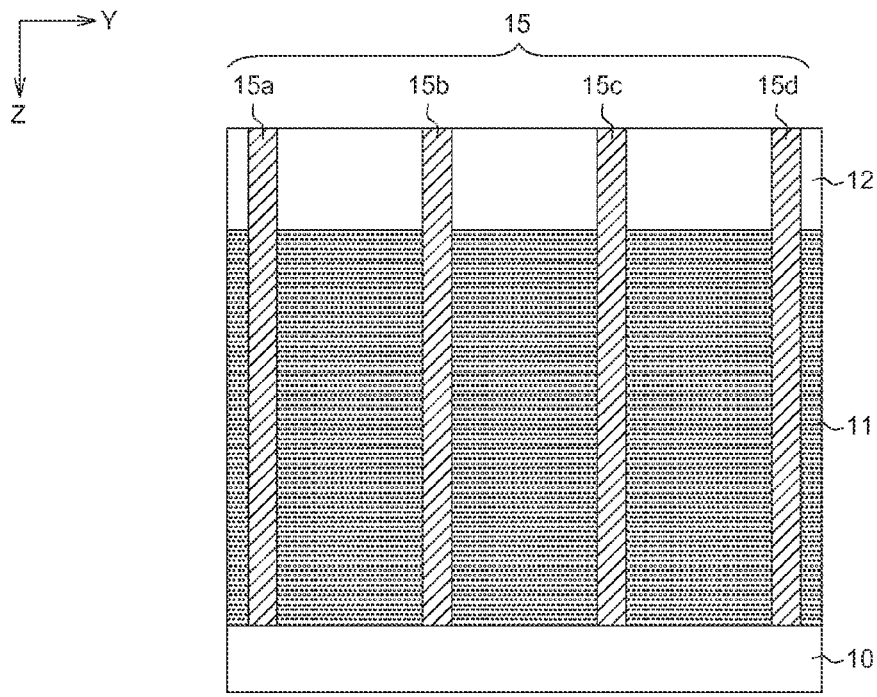

As shown in FIG. 1C, a first dielectric layer 15 is formed and fills into the trenches 14, thereby forming a plurality of first dielectric elements 15a, 15b, 15c and 15d in the trenches 14. In one embodiment, the first dielectric layer 15 is deposited on the dummy layer 12 and fills into the trenches 14, and then the first dielectric layer 15 is planarized, by such as etching back or chemical mechanical polishing (CMP), to align with a top surface of the dummy layer 12. In one embodiment, the first dielectric layer 15 could be a hard mask layer, which is made of a nitride layer such as silicon nitride or other suitable materials.

Figure 1D:
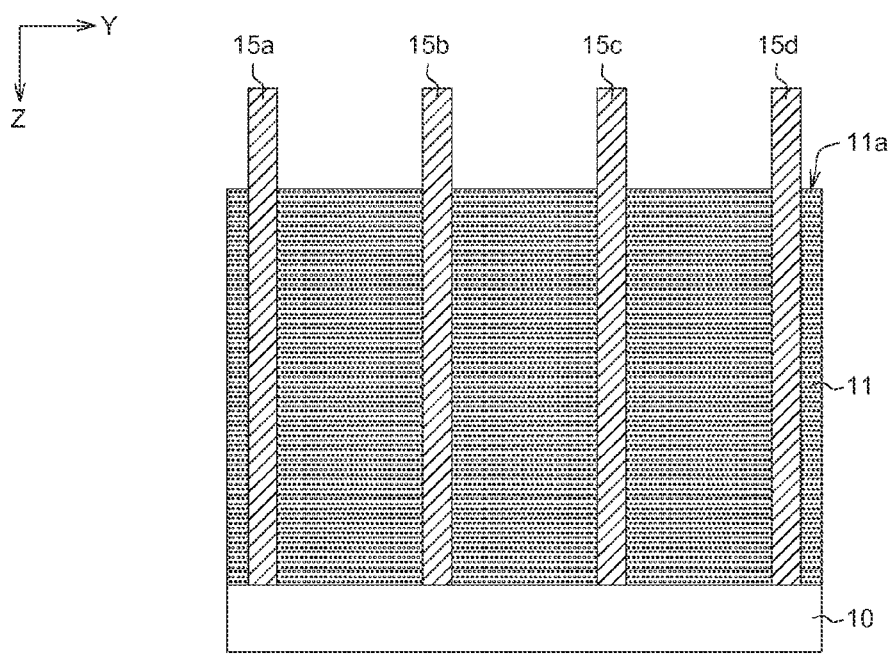

As shown in FIG. 1D, the dummy layer 12 is removed to expose parts of the first dielectric elements 15a, 15b, 15c and 15d. If a dummy oxide is used as the dummy layer 12 in one embodiment, the dummy layer 12 could be removed by etching back using HF dipping or dry etching. In the embodiment, the top surface 11a of the conductive layer 11 is exposed after removing the dummy layer 12, but the disclosure is not limited thereto. Those first dielectric elements 15a, 15b, 15c and 15d are trench reverse tone pattern, and could be used as the core pattern for the double pattern process.

Figure 1E:
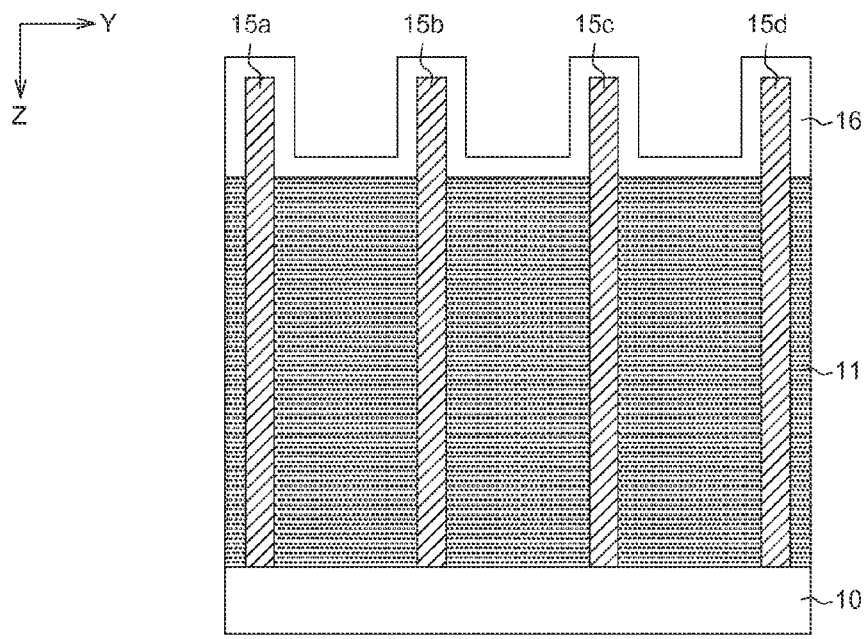

A second dielectric layer 16 is formed on the exposed parts of the first dielectric elements 15a, 15b, 15c and 15d, and the second dielectric layer 16 is patterned so that a spacer 16' is formed at a lateral side of each exposed first dielectric element. As shown in FIG. 1E, the second dielectric layer 16 is conformably deposited on the conductive layer 11 and covers the exposed parts of the first dielectric elements 15a, 15b, 15c and 15d. Then, the second dielectric layer 16 is patterned to expose the top surface of the first dielectric elements 15a, 15b, 15c and 15d and the top surface 11a of the conductive layer 11, thereby forming a spacer 16' at one lateral side of each exposed first dielectric element. In one embodiment, the second dielectric layer 16 could be a hard mask layer, which is made of a nitride layer such as silicon nitride or other suitable materials. Materials of the first dielectric layer 15 and the second dielectric layer 16 could be the same or different.

Figure 1F:
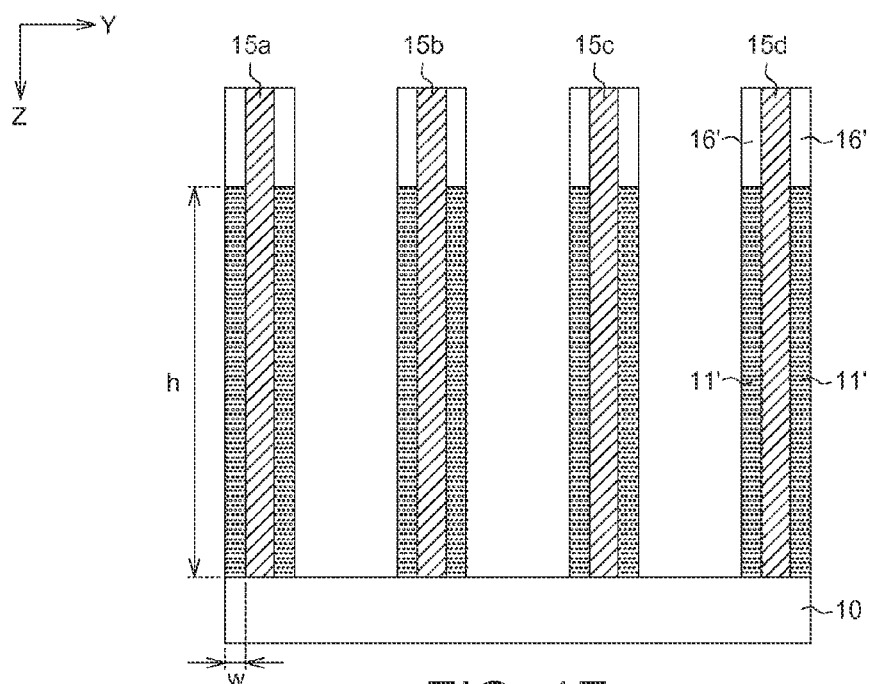

The conductive layer 11 is patterned by the spacers 16', so that a patterned conductive portion 11' is formed at each lateral side of each of the first dielectric elements 15a, 15b, 15c and 15d, as shown in FIG. 1F.

Additionally, the first dielectric elements 15a, 15b, 15c and 15d, as the core pattern for the double pattern process, could be remained inside the final structure or removed or replaced by other material, depending on the actual needs of the practical applications.

A double pattern is acquired according to the method described above. For higher, thinner, or large aspect ratio of height to width patterns, in particular those patterns in the 3D memory structure, they would be fallen down or bended easily during the manufacturing process. The method of the embodiment solves this issue. Compared to the structure manufactured by conventional process, the structure manufactured by the embodiment would not be fallen down or bended easily during the manufacturing process. Thus, the yield of the product manufactured by the embodiment has been greatly improved. In one embodiment, an aspect ratio of a height (h) of the patterned conductive portion 11', formed in step of patterning the conductive layer 11 by the spacers 16, to its width (w) is 10 or more than 10. However, the disclosure is not limited to those aspect ratios. Moreover, if the first dielectric elements 15a, 15b, 15c and 15d disposed between the patterned conductive portions 11' are remained inside the structure, as shown in FIG. 1F, the structure would be more strong and solid, and not be so easy to fall down.

Figure 2A:
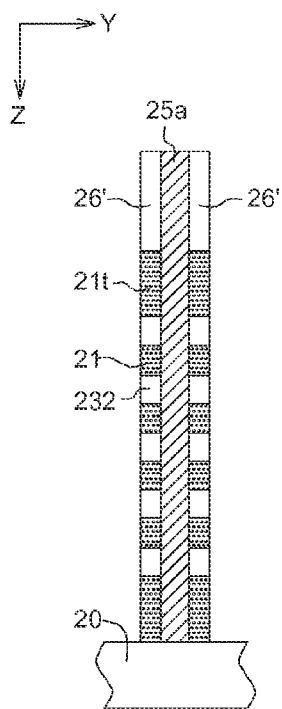
FIG. 2A~FIG. 2C illustrate three different types of the 3D memory structures according to the embodiments of the present disclosure, respectively.
Figure 2B:
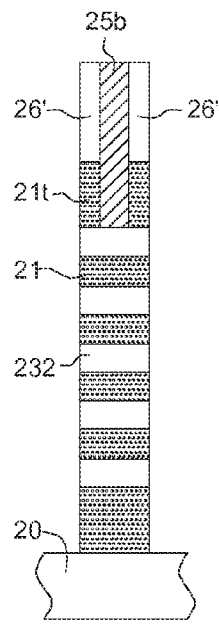
Figure 2C:
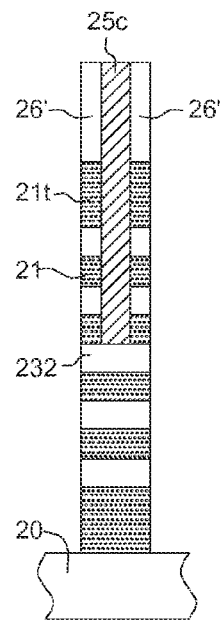

FIG. 2A~FIG. 2C illustrate three different types of the 3D memory structures according to the embodiments of the present disclosure, respectively. In FIG. 2A~FIG. 2C, each stack structure comprises a top conductive layer 21t, a plurality of conductive layers 21 and a plurality of insulating layers 232 alternately stacked on the substrate 20, and the spacers 26' are formed at two lateral sides of the first dielectric elements 25a, 25b and 25c and also formed on the top conductive layer 21t. The method for manufacturing the structures of FIG. 2A~FIG. 2C are very similar to the method illustrated in FIG. 1A~FIG. 1F, except for a single conductive layer of FIG. 1A~FIG. 1F being replaced by a stacked multi-layer as depicted in FIG. 2A~FIG. 2C. As shown in FIG. 2A, the first dielectric element 25a penetrates all the stacked multi-layer. As shown in FIG. 2B, the first dielectric element 25b penetrates the top conductive layer 21t and stop at the top insulating layers. As shown in FIG. 2C, the first dielectric element 25b penetrates the top conductive layer 21t and also two layers of the conductive layers 21. In FIG. 2B and FIG. 2C, the first dielectric elements only penetrate part of the stacked multi-layers, wherein the patterned portions of the top conductive layer 21t have double density than the un-patterned conductive layers 21 beneath. In this disclosure, the stop position of the first dielectric element is not limited to the particular position, and could be varied and adjusted based on the structural requirement of double patterning of the practical applications, such as constructions of the first dielectric elements 25a, 25b and 25c or other variations.

According to the descriptions above, the manufacturing method of the embodiment could be applied to the semiconductor device with a single conductive layer, or a 3D stacked multi-layer with the alternately arranged conductive layers and insulating layers. One of the 3D memory structures and method for manufacturing the 3D memory structure applied by the method of the embodiment (double patterning process) are disclosed below.

Figures 3A, 3B:
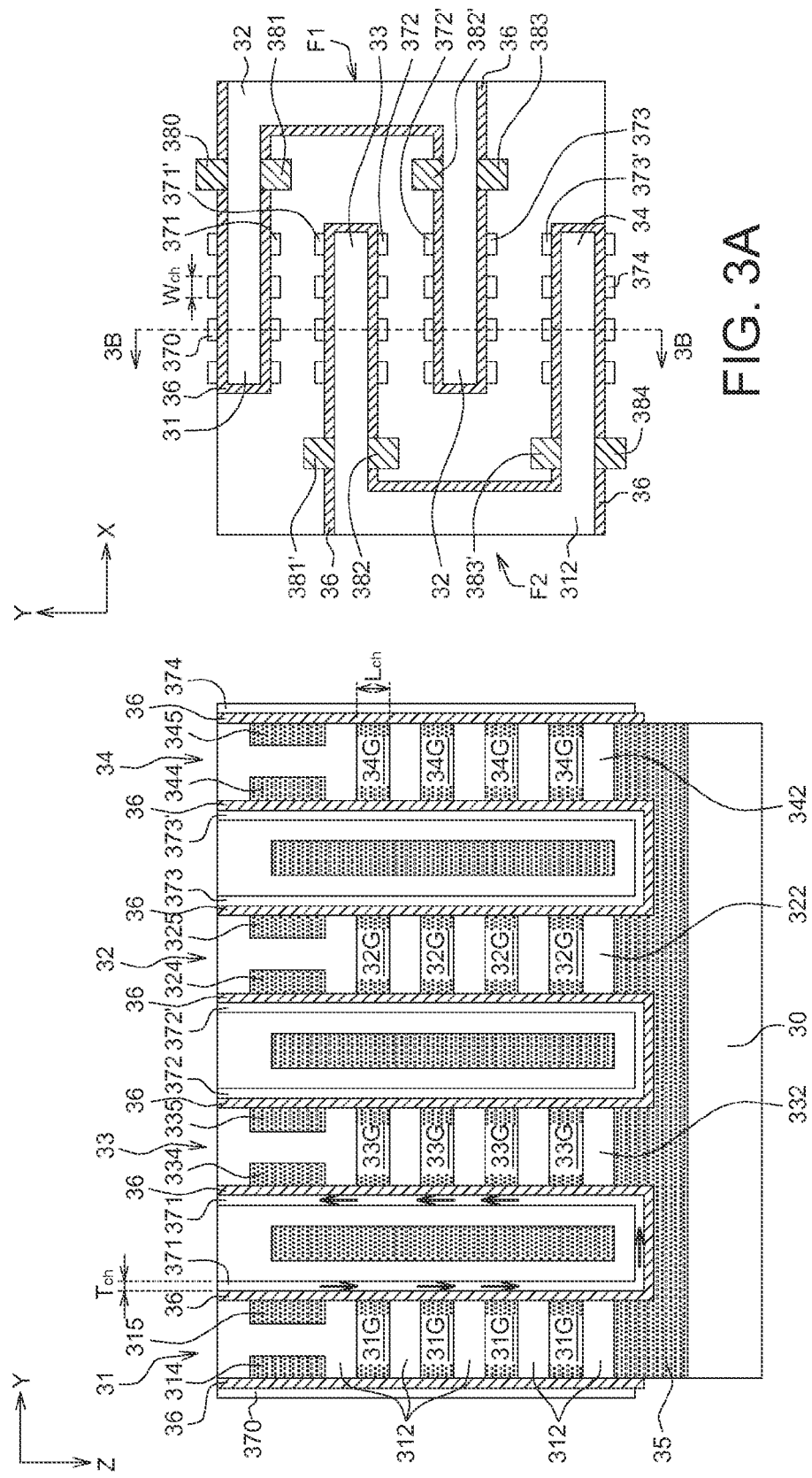
FIG. 3A is a top view of a 3D memory structure according to one of the applications manufactured by the embodiment of the present disclosure.
FIG. 3B is a cross-sectional view of the 3D memory structure along the cross-sectional line 3B-3B of FIG. 3A.

Please refer to FIG. 3A and FIG. 3B. FIG. 3A is a top view of a 3D memory structure according to one of the applications manufactured by the embodiment of the present disclosure.

FIG. 3B is a cross-sectional view of the 3D memory structure along the cross-sectional line 3B-3B of FIG. 3A. Also, FIG. 3A and FIG. 3B show the 3D memory structure in a xy-plane and a zy-plane, respectively. In this application, the 3D memory structure comprises a plurality of stacked structures (31-34) vertically (z-direction) formed on a substrate 30. As shown in FIG. 3A, the 3D memory structure may comprise (but not limited) a first finger-shaped stacked section F1 and a second finger-shaped stacked section F2 vertically formed on the substrate and staggered oppositely. The first finger-shaped stacked section F1 at least includes a first stacked structure 31 and a second stacked structure 32 extending along −x direction in the xy-plane. The second finger-shaped stacked section F2 at least includes a third stacked structure 33 and a fourth stacked structure 34 extending along +x direction in the xy-plane. The third stacked structure 33 extends between the first stacked structure 31 and the second stacked structure 32, while the second stacked structure 32 extends between the third stacked structure 33 and the fourth stacked structure 34. As shown in FIG. 3B, from bottom to top and along the z direction, each of the first to fourth stacked structures 31-34 comprises a bottom gate 35, a plurality of gates 31G/32G/33G/34G and gate insulators 312/322/332/342 alternately stacked on the bottom gate 35, and two selection lines 314/324/334/344 and 315/325/335/345 independently formed above the gates 31G/32G/33G/34G. The bottom gates 35 of the first to fourth stacked structures 31-34 are electrically connected to each other, to form an U-shaped bottom gate (UBG) for being a pass gate. The gates 31G/32G/33G/34G function as the word lines of the 3D memory structure. In one of the stacked structures 31-34, the selection lines above the gate are spaced apart form each other and independently controlled. In the embodiment, the gates and the selection lines are made of conductive material such as heavily doped polysilicon. In the embodiment, the layer of selection lines is thicker than the layer of each gate, but the disclosure is not limited thereto. The 3D memory structure of the application further comprises a plurality of charge trapping multilayers 36 (such as ONO or ONONO) formed outsides of the first to fourth stacked structures 31-34 and extending to the bottom gates 35. The charge trapping multilayers 36 between two adjacent stacked structures present a U-shaped cross-section (FIG. 3B). The 3D memory structure further comprises a plurality of ultra-thin channels 370, 371, 371', 372, 372', 373, 373' and 374 formed at outsides of the charge trapping multilayers 36 and lined between the adjacent stacked structures. The ultra-thin channels are formed at outsides of the charge trapping multilayers 36 and extend downwardly, wherein two of the ultra-thin channels (ex: 371+371', 372+372', 373+373') between the opposite sides of adjacent stacked structures of the first to fourth stacked structures 31-34 correspondingly constitute an ultra-thin U-shaped channel. The current path in the ultra-thin U-shaped channel is denoted by the arrows in FIG. 3B.

In the embodiment, the two selection lines of each stacked structure are two string selection lines (SSLs) or two ground selection lines (GSLs), and the charge trapping multilayers 36 between the adjacent stacked structures are electrically connected to one string selection line SSL and one ground selection line GSL. For example, the selection lines 314 and 315 of the first stacked structure 31 and the selection lines 324 and 325 of the second stacked structure 32 in FIG. 3B are GSLs, while the selection lines 334 and 335 of the third stacked structure 33 and the selection lines 344 and 345 of the fourth stacked structure 34 in FIG. 3B are SSLs. For the adjacent stacked structures, such as the first stacked structure 31 and third stacked structure 33, the charge trapping multilayers 36 beside the ultra-thin channels (ex: 371 and 371') are electrically connected to one GSL (315) and one SSL (334). The adjacent SSL and GSL function as a switch of the corresponding ultra-thin U-shaped channel. For example, the ultra-thin U-shaped channel (371+371') between the first stacked structure 31 and the third stacked structure 33 can be selectively turned on by the adjacent SSL 315 and SSL 334. In this application, a thickness of each gate 31G/32G/33G/34G is defined as a channel length (Lch) as denoted in FIG. 3B. A channel width (Wch) is denoted in FIG. 3A. The 3D memory structure further comprise a plurality of word line selectors (WLS) 380, 381, 381', 382, 382', 383, 383' and 384, respectively disposed at two sides of one end of each stacked structure (31/32/33/34) and electrically connected to the charge trapping multilayers 36.

Figure 4A:
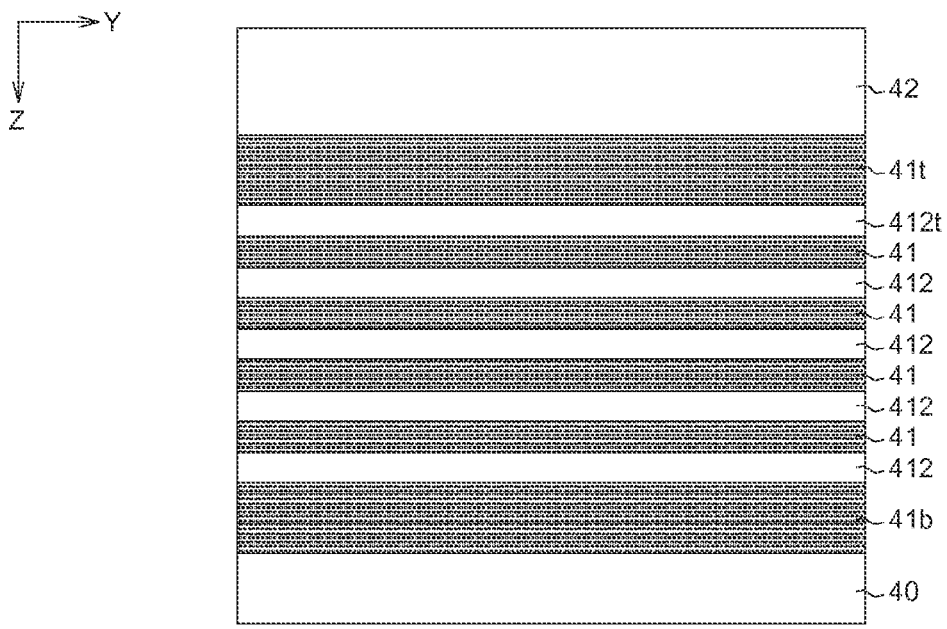

FIG. 4A~FIG. 4K illustrate a method for manufacturing a 3D memory structure according to the second embodiment of the disclosure. As shown in FIG. 4A, a substrate 40 is provided, and a stacked multi-layer (similar to the conductive layer 11 of FIG. 1A) is formed on the substrate 40. The stacked multi-layer comprises a top conductive layer 41t, a plurality of conductive layers 41, a bottom conductive layer 41b and a plurality of insulating layers 412 alternately stacked on the substrate 40. A dummy layer 42 is formed on the stacked multi-layer. In one embodiment, an oxide layer (i.e. dummy oxide layer) or other suitable materials could be deposited to form on the stacked multi-layer as the dummy layer 42.

Figure 4B:
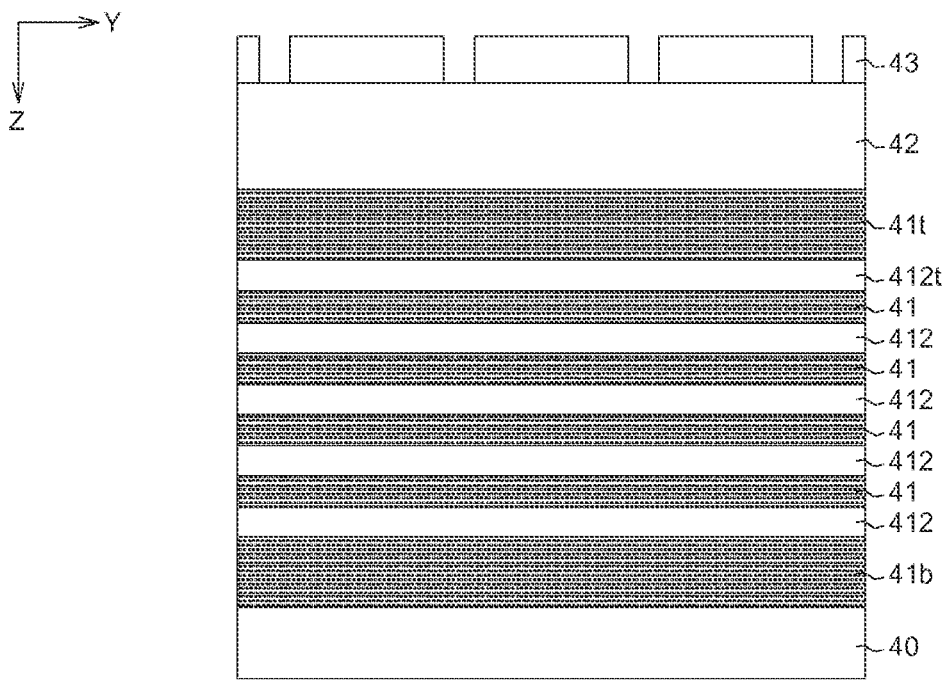
Figure 4C:
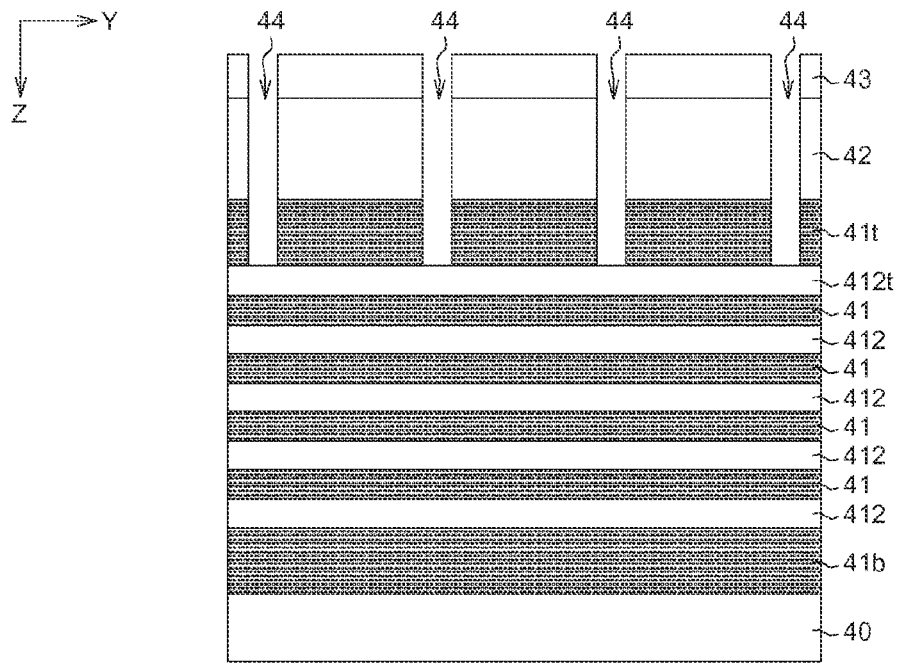

The dummy layer 42 and at least a portion of the stacked multi-layer are patterned. In the embodiment, a patterned PR 43 formed on the dummy layer 42, as shown in FIG. 4B; and then, the dummy layer 12 and the top conductive layer 41t are patterned by the patterned PR 43 to form the trenches 44, as shown in FIG. 4C. In this embodiment, the trenches 14 expose the surface of the top insulating layer 412t. However, the disclosure is not limited thereto, and it is also applicable to etch only a portion of the conductive layer 11. This trench pattern is a reverse tone of the core pattern for the double pattern process.

Figure 4D:
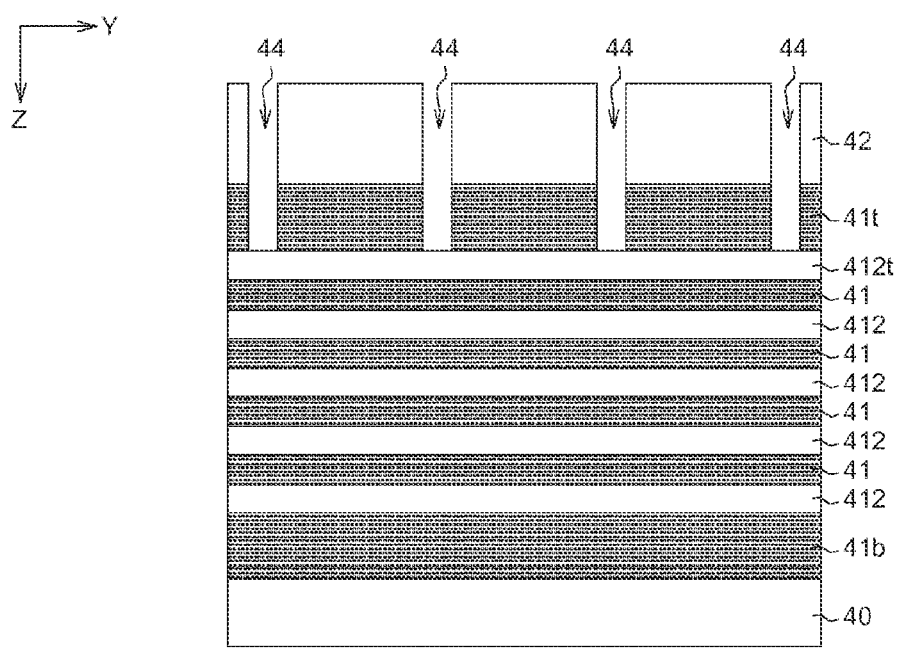

Afterwards, the patterned PR 43 is removed, as shown in FIG. 4D.

Figure 4E:
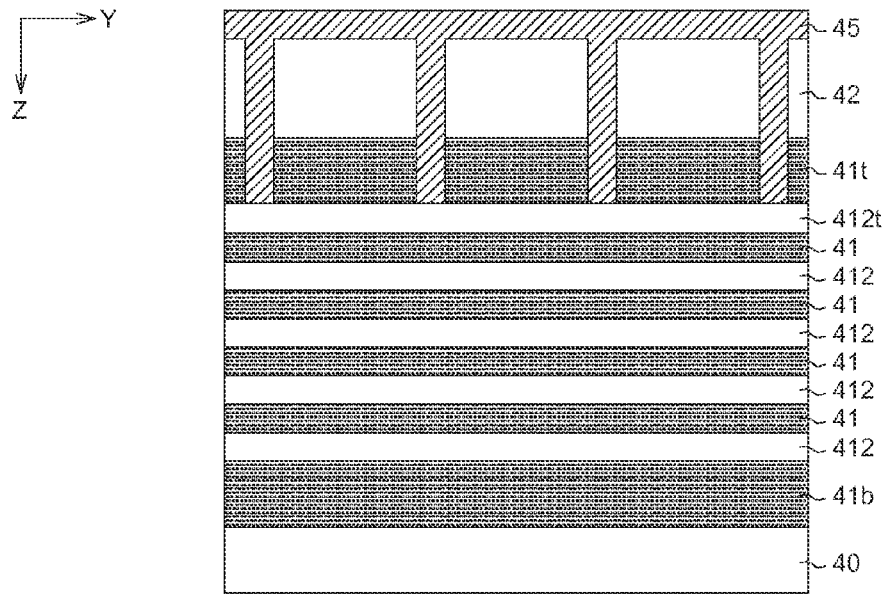
Figure 4F:
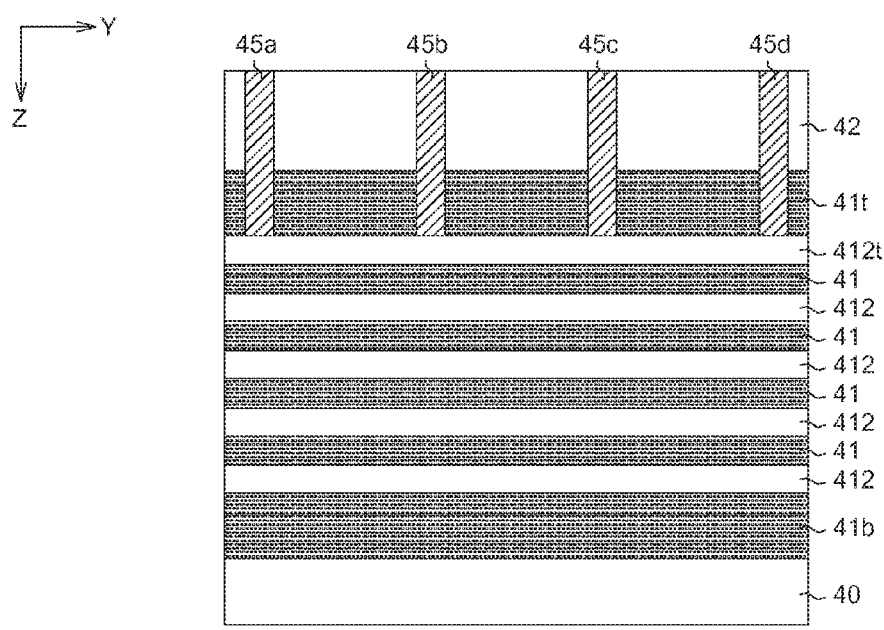

As shown in FIG. 4E, a first dielectric layer 45 is formed and fills into the trenches 44, thereby forming a plurality of first dielectric elements 45a, 45b, 45c and 45d in the trenches 44. In one embodiment, the first dielectric layer 45 could be a hard mask layer, which is made of a nitride layer such as silicon nitride or other suitable materials. Then, the first dielectric layer 45 is planarized, by such as etching back or chemical mechanical polishing (CMP), to substantially align with a top surface of the dummy layer 42, as shown in FIG. 4F. The bottoms of the first dielectric elements 45a, 45b, 45c and 45d contact the top insulating layer 412t.

Figure 4G:
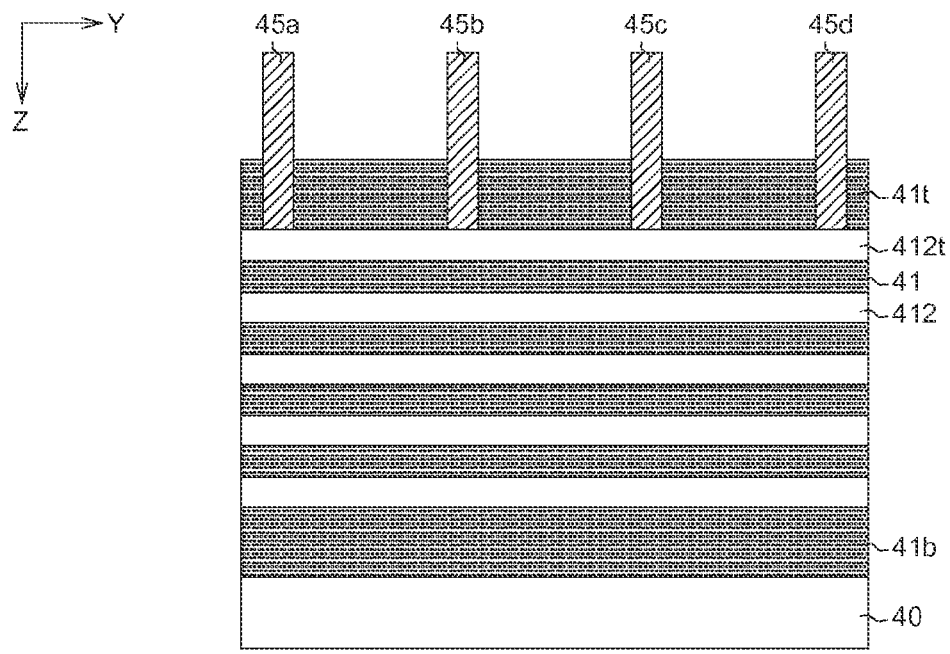

As shown in FIG. 4G, the dummy layer 42 is removed to expose parts of the first dielectric elements 45a, 45b, 45c and 45d and the surface of the top conductive layer 41t. If a dummy oxide is used as the dummy layer 42 in one embodiment, the dummy layer 42 could be removed by etching back using HF dipping or dry etching. Those first dielectric elements 45a, 45b, 45c and 45d could be used as the core pattern for the double pattern process.

Figure 4H:
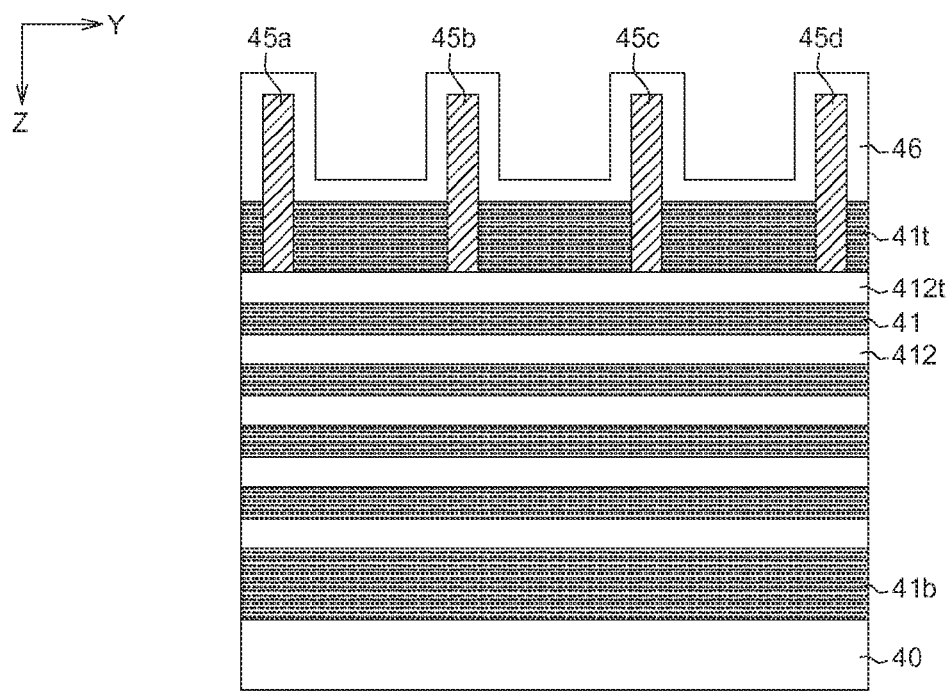

A second dielectric layer 46 is conformably formed on the exposed parts of the first dielectric elements 45a, 45b, 45c and 45d, to form a spacer layer, as shown in FIG. 4H. The second dielectric layer 46 could be a hard mask layer, which is made of a nitride layer such as silicon nitride or other suitable materials.

Please refer to FIG. 3A, FIG. 3B, FIG. 4I and FIG. 4I'. FIG. 4I' is a top view of the structure of FIG. 4I. The 3D memory structure of the application further comprises a plurality of layer contact lines formed at the layer contact regions, Ac, at the sides of the first finger-shaped stacked section F1 and the second finger-shaped stacked section F2, and the layer contact lines have layer contacts electrically connected to the bottom gate, the gates and the selection lines correspondingly for transmitting signals. After forming the second dielectric layer 46, a patterned PR is deposited to cover the layer contact regions Ac for protecting the non-etched areas, as shown in FIG. 4I'. Then, the second dielectric layer 46 is patterned so that a spacer 46' is formed at a lateral side of each exposed first dielectric element. As shown in FIG. 4I, the top surface of the first dielectric elements 45a, 45b, 45c and 45d and the top surface of the top conductive layer 41t are exposed after etching the second dielectric layer 46.

Figure 4J:
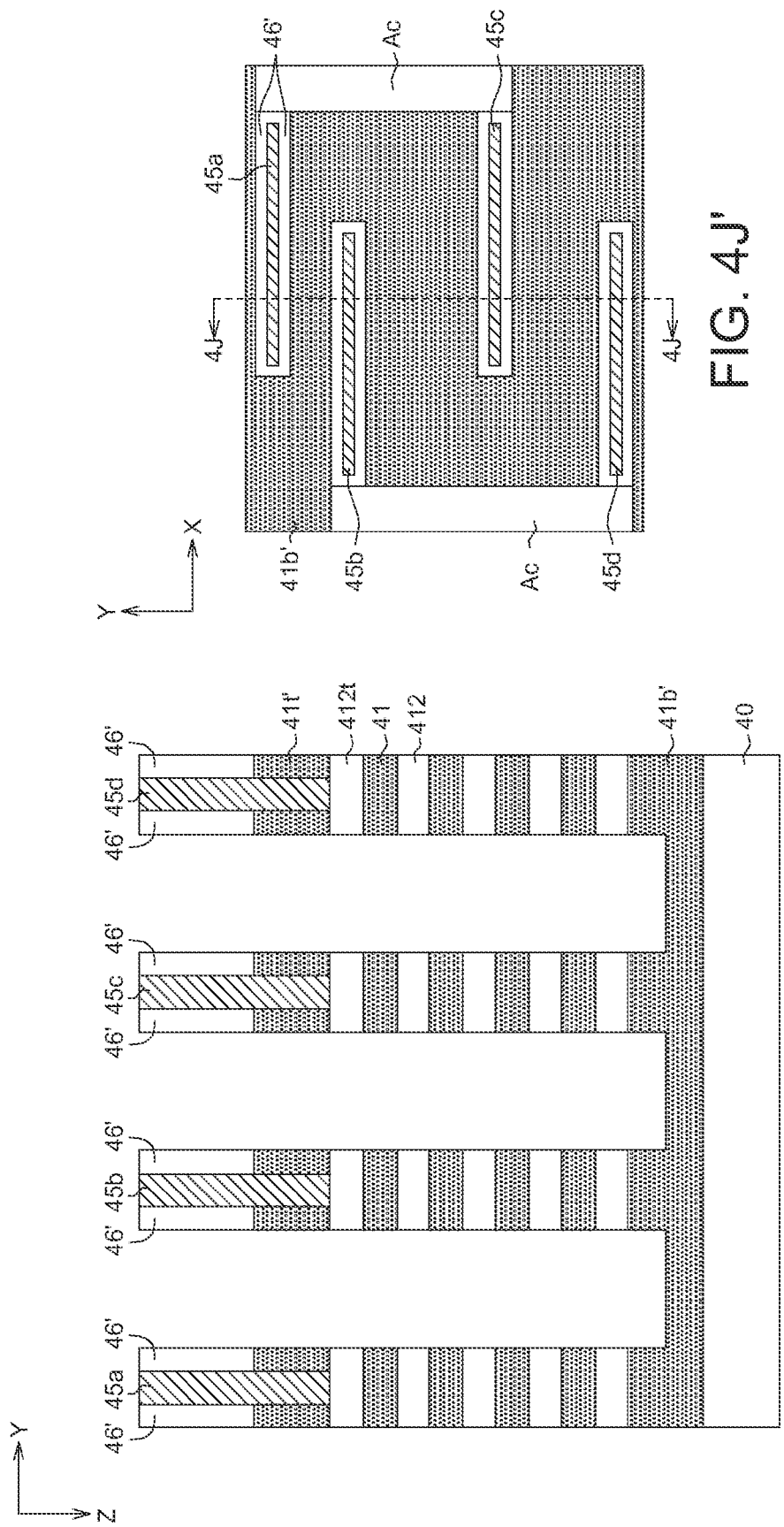

The stacked multi-layer is patterned by the spacers 46' to form a plurality of the stacked structures vertically on the substrate 40, and a portion of a bottom conductive layer 41b' is exposed, wherein a patterned top conductive portion 41t' is formed at each lateral side of each first dielectric element 45a/45b/45c/45d, as shown in FIG. 4J. FIG. 4J' is a top view of the structure of FIG. 4J.

Afterward, the patterned PR on the layer contact regions Ac is removed, and the spacers 46' and the first dielectric elements 45a, 45b, 45c and 45d are removed, as shown in FIG. 4K. FIG. 4K' is a top view of the structure of FIG. 4K. The patterned top conductive portions 41t' are the selection lines as depicted in FIG. 3A and FIG. 3B.

Please refer to FIG. 3A and FIG. 3B. Each stacked structure of FIG. 4K comprises the bottom conductive layer 41b' functioning as a bottom gate 35, the conductive layers 41 and the insulating layers 412 respectively functioning as a plurality of gates 31G/32G/33G/34G and a plurality of gate insulators 312 alternately stacked on the bottom gate 35, and two patterned top conductive portions 41t' functioning as two selection lines SSL/GSL spaced apart above the gates and independently controlled. The bottom gates 35 of the stacked structures are electrically connected to each other.

According to the double patterning process of the embodiment described above, the patterned top conductive portions 41t' have double density than the conductive layers 41 beneath.

FIG. 4L~FIG. 4N-2 illustrate the process subsequent to steps illustrated in FIG. 4A~FIG. 4K for manufacturing the 3D memory structure. Please refer to FIG. 4L and FIG. 4L'. FIG. 4L' is a top view of the structure of FIG. 4L. After step as illustrated in FIG. 4K, a PR 51 could be formed as blanked on the structure, and the PR 51 is patterned to expose the unwanted areas, such as the end portions of the stacked structures as shown in FIG. 4L'.

Figure 4M:
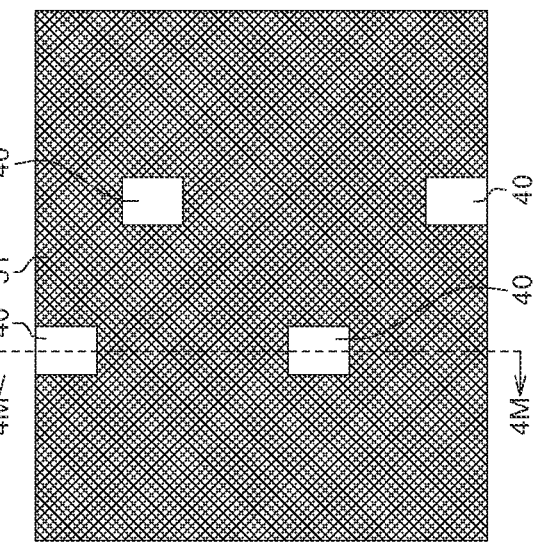
Figure 4M:
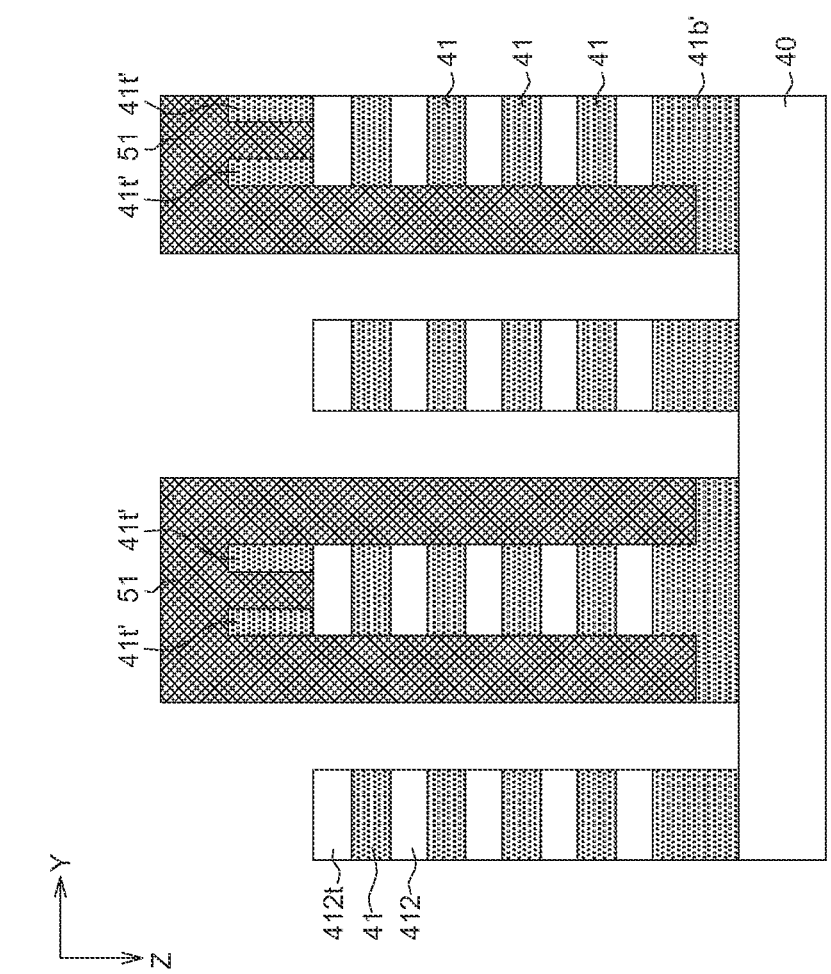

Please refer to FIG. 4M and FIG. 4M'. FIG. 4M' is a top view of the structure of FIG. 4M. In the end portions of the stacked structures, the conductive layers within the unwanted areas are then removed such as by etching. Therefore, the unwanted areas reveal the surface of the substrate, as shown in FIG. 4M'.

Figures 2, 4N:
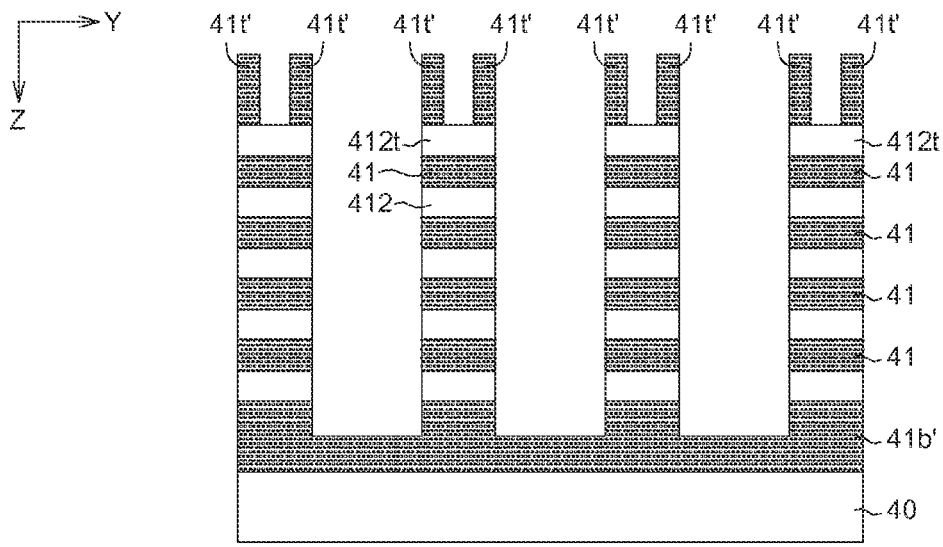
Figure 5A:
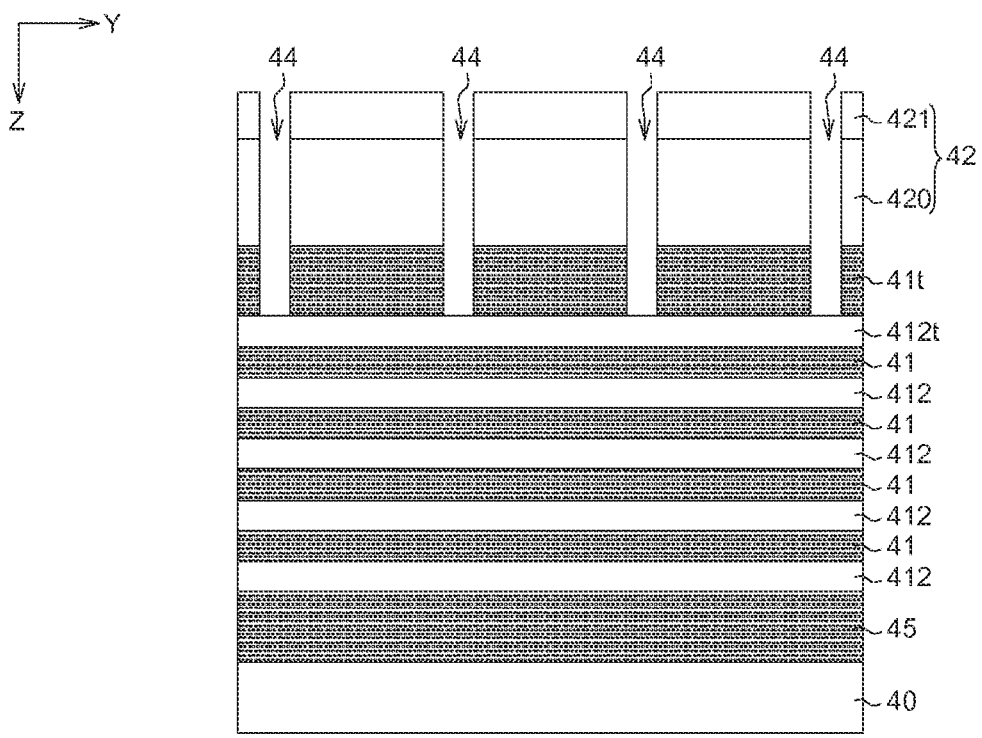
FIG. 5A~FIG. 5F illustrate a method for manufacturing another 3D memory structure according to the third embodiment of the disclosure.
Figure 5B:
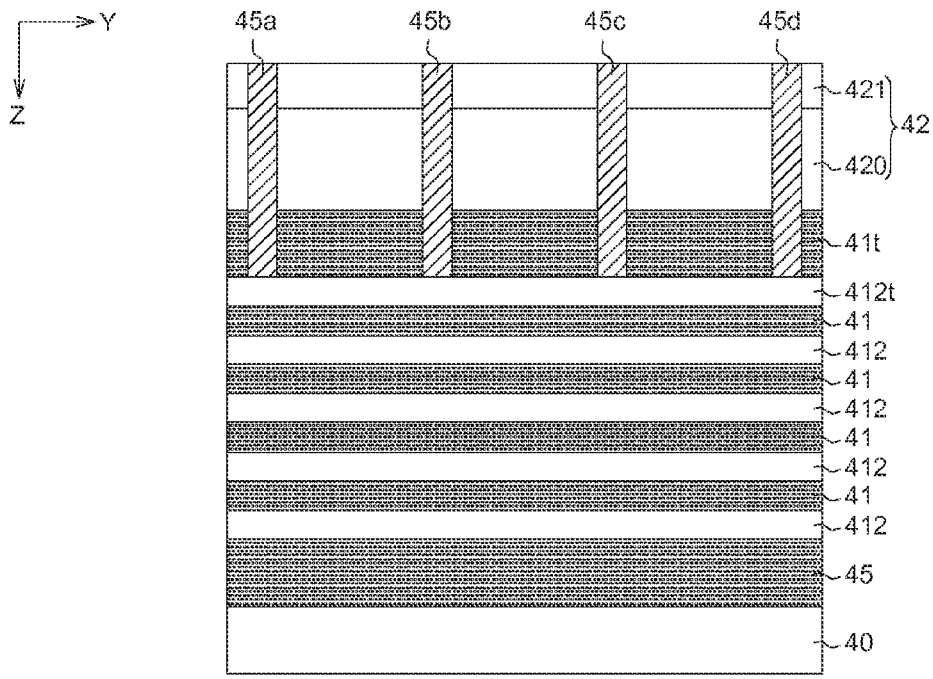
Figure 5C:
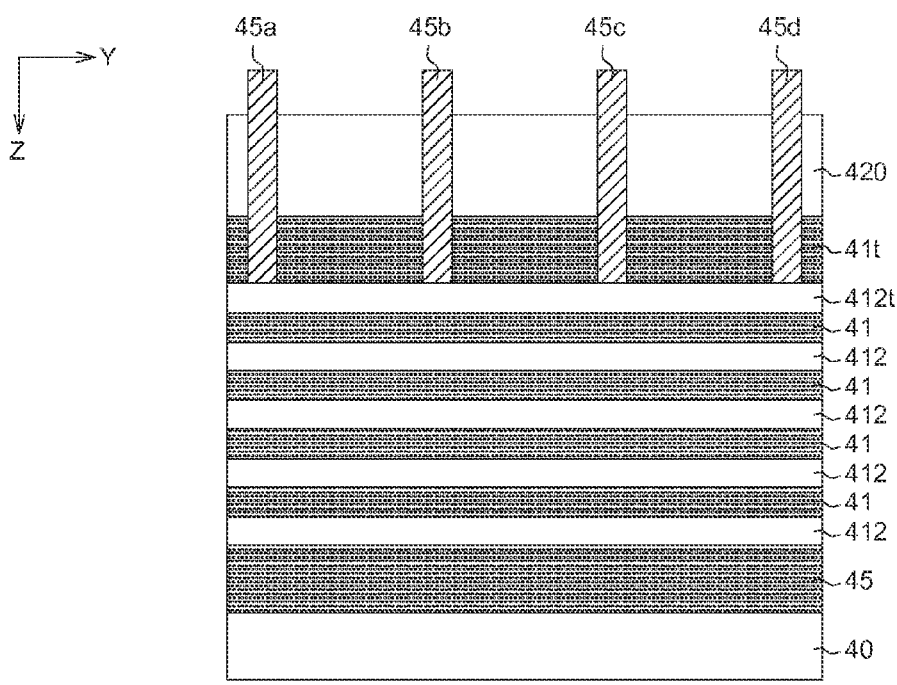
Figure 5D:
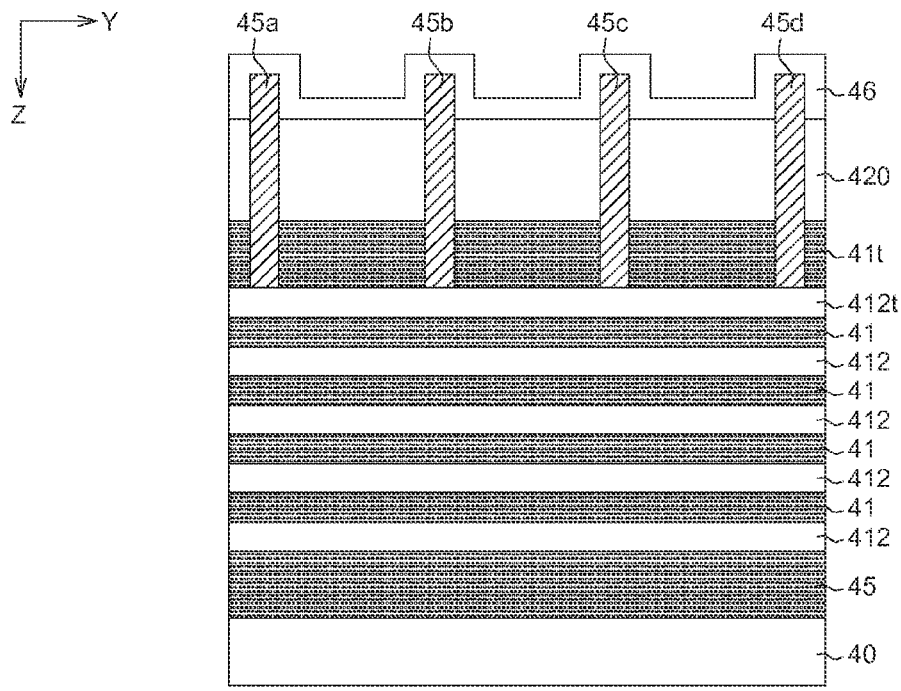
Figure 5E:
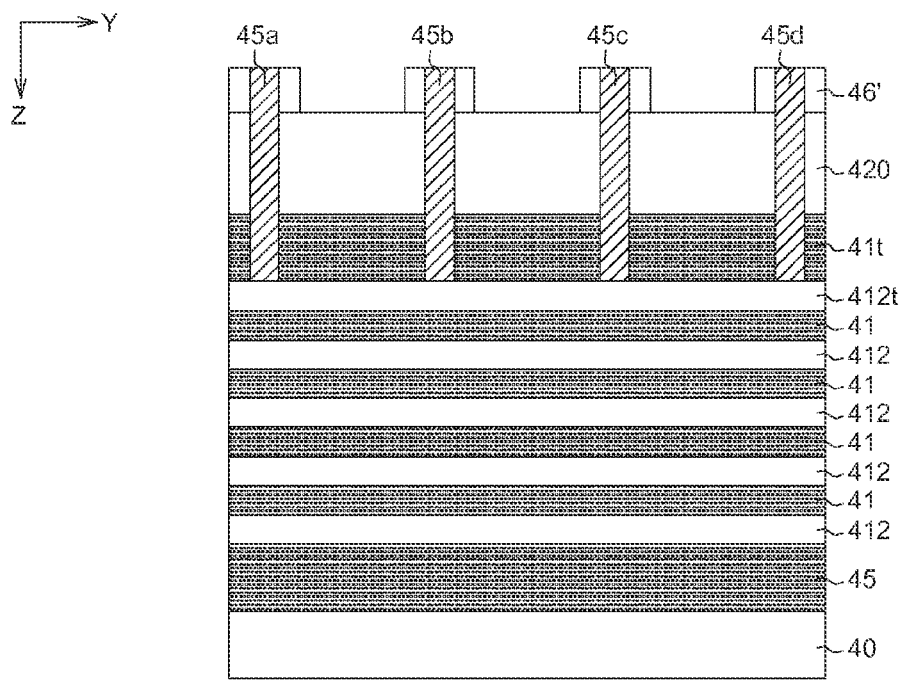
Figure 5F:
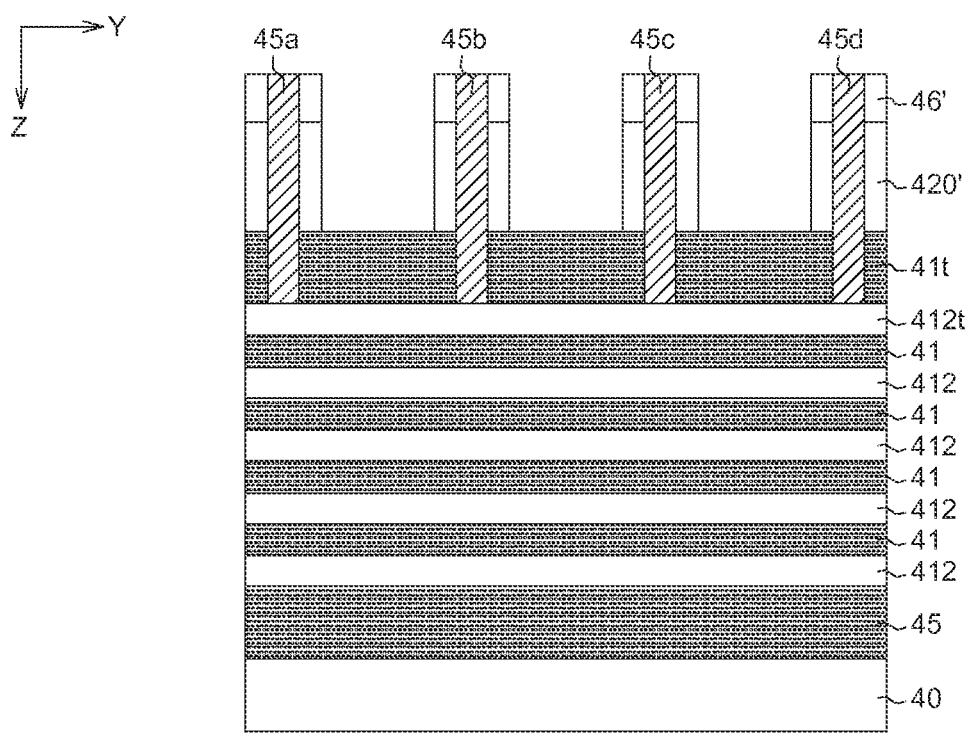

Afterwards, the PR 51 is removed. Please refer to FIG. 4N-1, FIG. 4N-2 and FIG. 4N'. FIG. 4N' is a top view of the structures of FIG. 4N-1 and FIG. 4N-2. FIG. 4N-1 and FIG. 4N-2 are cross-sectional views along the cross-sectional lines 4N-1 and 4N-2 of FIG. 4N'.

Although a single layer is used as the dummy layer 12/42 in the embodiments described above, the disclosure is not limited thereto. Two or more material layers could be adopted for being the dummy layer, depending on the process conditions of the practical application. FIG. 5A~FIG. 5F illustrate a method for manufacturing another 3D memory structure according to the third embodiment of the disclosure. The elements in the third embodiment identical to that in the second embodiment are designated by the same reference numbers, and the structural details and related steps are not redundantly described.

The manufacturing steps of the second and third embodiments are very similar. The difference between the methods of the second and third embodiments is the dummy layer. In the third embodiment, the dummy layer includes another dielectric layer 420 formed on the top conductive layer 41t and an oxide layer 421 formed on the dielectric layer 420. In one embodiment, the dielectric layer 420 could be a hard mask layer, which is made of a nitride layer such as silicon nitrite or other suitable materials. Material of the dielectric layer 420 could be the same or different from that of the first and second dielectric layers as described before. After the first dielectric elements 45a, 45b, 45c and 45d are formed in the trenches 44, the oxide layer 421 is removed, and the dielectric layer 420 is exposed. Similarly, steps such as depositing the spacer layer 46 (FIG. 5D), etching the spacer layer 46 (FIG. 5E) and patterning the dielectric layer 420 according to the spacers 46' (FIG. 5F), are subsequently performed, which are not redundantly described herein. The stacked multi-layer could be further patterned (by the steps illustrated as FIG. 4J) to form the stacked structures.

It is noted that the manufacturing methods as described above are provided for illustration, and people who known in the art could adjust and modify the steps based on the knowledge or the steps above. The disclosure is not limited to the steps as disclosed above, and the exemplified steps could be adjusted and changed based on the actual needs of the practical applications. According to the aforementioned description, the spacer self-aligned double-patterning process (SADP) is adopted for manufacturing the upper portion of the conductive layer, so that the upper patterns of the upper portion have double density than the lower patterns of the lower portion of the conductive layer. According to the embodiments, the manufacturing methods could be conducted rapidly, simply and accurately. Also, the collapse issue of thin-and-high patterns (ex: fallen down or bended) easily occurred in the conventional manufacturing process could be solved by adopting the embodiments of the disclosures. Thus, a 3D memory structure with high speed and solid construction could be obtained by manufacturing methods of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing semiconductor device, comprising:

providing a substrate with a conductive layer formed thereon;

forming a dummy layer on the conductive layer, and patterning the dummy layer and at least a portion of the conductive layer to form a plurality of trenches;

forming a first dielectric layer to fill into the trenches so as to form a plurality of first dielectric elements in the trenches;

removing the dummy layer to expose parts of the first dielectric elements;

forming a second dielectric layer on the exposed parts of the first dielectric elements, and patterning the second dielectric layer so that a spacer is formed at a lateral side of each exposed first dielectric element; and patterning the conductive layer by the spacers, so that a patterned conductive portion is formed at each of the lateral sides of each first dielectric element.

2. The method for manufacturing semiconductor device according to claim 1, wherein the parts of the first dielectric elements and a surface of the conductive layer are exposed after the dummy layer is removed.

3. The method for manufacturing semiconductor device according to claim 1, wherein an aspect ratio of a height of the patterned conductive portion, formed in step of patterning the conductive layer by the spacers, to its width is 10 or more than 10.

4. The method for manufacturing semiconductor device according to claim 1, wherein the conductive layer is a single conductive layer.

5. The method for manufacturing semiconductor device according to claim 1, wherein the conductive layer is a stacked multi-layer, comprising a plurality of conductive layers and a plurality of insulating layers alternately stacked on the substrate.

6. The method for manufacturing semiconductor device according to claim 5, wherein the dummy layer and a top conductive layer are patterned to form the trenches, and the trenches expose a top insulating layer.

7. The method for manufacturing semiconductor device according to claim 6, wherein the parts of the first dielectric elements and a surface of the top conductive layer are exposed after the dummy layer is removed.

8. The method for manufacturing semiconductor device according to claim 7, wherein the stacked multi-layer is patterned by the spacers to form a plurality of the stacked structures vertically on the substrate, and a portion of a bottom conductive layer is exposed, wherein a patterned top conductive portion is formed at each lateral side of each first dielectric element.

9. The method for manufacturing semiconductor device according to claim 8, wherein each stacked structure comprises:

the bottom conductive layer, functioning as a bottom gate, wherein the bottom gates of the stacked structures are electrically connected to each other;

the conductive layers and the insulating layers, respectively functioning as a plurality of gates and a plurality of gate insulators, and alternately stacked on the bottom gate; and two of the patterned top conductive portions, functioning as two selection lines, formed above the gates and spaced apart form each other, and the selection lines being independently controlled.

* * * * *